US008878470B2

(12) United States Patent
Camilleri et al.

(10) Patent No.: US 8,878,470 B2
(45) Date of Patent: Nov. 4, 2014

(54) METHODS AND APPARATUS FOR REDUCING SIZE AND COSTS OF MOTOR CONTROLLERS FOR ELECTRIC MOTORS

(75) Inventors: Steven Peter Camilleri, Woolner (AU); Lyell Douglas Embery, Stuart Park (AU); Byron John Kennedy, Chelsea (AU)

(73) Assignee: Regal Beloit America, Inc., Beloit, WI (US)

( * ) Notice: Subject to any disclaimer, the term of this patent is extended or adjusted under 35 U.S.C. 154(b) by 608 days.

(21) Appl. No.: 13/275,735

(22) Filed: Oct. 18, 2011

(65) Prior Publication Data
US 2013/0093296 A1    Apr. 18, 2013

(51) Int. Cl.
*H02P 6/00* (2006.01)
*H02K 11/00* (2006.01)
*H05K 1/02* (2006.01)
*H05K 1/05* (2006.01)

(52) U.S. Cl.
CPC .......... *H02K 11/0073* (2013.01); *H05K 1/0216* (2013.01); *H05K 1/0203* (2013.01); *H05K 1/05* (2013.01)
USPC .............. 318/400.01; 318/400.3; 318/400.26; 318/722

(58) Field of Classification Search
USPC ............... 318/400.01, 400.22, 400.26, 400.3, 318/722, 244; 310/52, 53, 59, 68 R, 68 C, 310/68 D; 361/688, 702, 720, 722, 728, 361/736, 737, 738
See application file for complete search history.

(56) References Cited

U.S. PATENT DOCUMENTS

| | | | | |
|---|---|---|---|---|
| 4,668,898 | A * | 5/1987 | Harms et al. | 318/400.21 |
| 5,619,111 | A * | 4/1997 | Katagiri et al. | 318/625 |
| 6,700,244 | B2 * | 3/2004 | Hsu | 310/75 R |
| 6,977,475 | B2 | 12/2005 | Kuribayashi et al. | |
| 7,742,303 | B2 * | 6/2010 | Azuma et al. | 361/699 |
| 7,961,487 | B2 | 6/2011 | Seto et al. | |
| 7,978,468 | B2 * | 7/2011 | Nakatsu et al. | 361/689 |
| 8,324,769 | B2 * | 12/2012 | Clendenen | 310/68 D |
| 2004/0017173 | A1 | 1/2004 | Iotti | |
| 2007/0182350 | A1 | 8/2007 | Patterson et al. | |
| 2011/0068661 | A1 | 3/2011 | Clendenen | |

OTHER PUBLICATIONS

An International Search Report and Written Opinion, dated Jan. 7, 2013, for co-pending International application No. PCT/US2012/059373.

* cited by examiner

*Primary Examiner* — Bentsu Ro
*Assistant Examiner* — Thai Dinh
(74) *Attorney, Agent, or Firm* — Armstrong Teasdale LLP

(57) ABSTRACT

An electric motor that includes an electronic motor controller is described. The electronic motor controller includes a motor management circuit and a power supply circuit physically separate from the motor management circuit. The motor management circuit includes an insulated metal substrate, driver components operably attached to the insulated metal substrate and operable to provide output signals for application to windings of the electric motor, at least one current sensor operable for sensing an amount of current applied to the windings of and electric motor, and at least one control device operably attached to the insulated metal substrate for controlling operation of the driver components. The power supply circuit includes a composite circuit card and power processing components operably attached to the circuit card and operable to convert an input voltage into at least one output voltage to be supplied to the motor management circuit.

19 Claims, 5 Drawing Sheets

METHODS AND APPARATUS FOR REDUCING SIZE AND COSTS OF MOTOR CONTROLLERS FOR ELECTRIC MOTORS

BACKGROUND

The field of the disclosure relates generally to electric motor controllers, and more specifically to methods and apparatus for reducing size and costs of motor controllers for electric motors.

Devices commonly known as electronic motor controllers are utilized in the operation of certain electric motors. For example, such motor controller devices are required for some electric motor technologies such as brushless permanent magnet motors.

Typically, the motor controller device is a significant contributor to the cost of a total motor drive solution. Current motor controller configurations are typical across a range of industries and regions, which allows a permanent magnet motor to operate from fixed frequency AC power supply and have an adjustable output. These controller configurations generally consist of a single circuit board containing a single or multiple phase bridge circuit, a digital control element such as a microcontroller or Digital Signal Processor (DSP), a low voltage power supply, electrolytic bus capacitors, a diode bridge and filtering devices. Sometimes power factor correction is included in these motor controllers.

With the single circuit board configuration, the form factor of the power control components used in the motor controller drive the form factor of the remainder of the components of the motor controller.

BRIEF DESCRIPTION

In one aspect, an electric motor that includes an electronic motor controller is provided. The electronic motor controller includes a motor management circuit board and a power supply circuit board physically separate from the motor management circuit board. The motor management circuit board includes an insulated metal substrate, a plurality of driver components operably attached to the insulated metal substrate and operable to provide output signals for application to windings of the electric motor, at least one current sensor operable for sensing an amount of current applied to the windings of and electric motor, and at least one control device operably attached to the insulated metal substrate and programmed to control operation of the driver components. The power supply circuit board includes a printed circuit card comprising a composite material and a plurality of power processing components operably attached to the printed circuit card and operable to convert an input voltage into at least one output voltage to be supplied to the motor management circuit board.

In another aspect, a method for reducing an overall size of an electronic motor controller for an electric motor is provided. The method includes fabricating a circuit board using an insulated metal substrate operable as a heat sink for a plurality of components mounted thereon, attaching a plurality of driver components, at least one current sensor, and at least one control device to the circuit board to form a motor management circuit board, fabricating a printed circuit board physically separate from the motor management circuit board using a composite material, attaching a plurality of power processing components to the printed circuit card to form a power supply circuit board operable to convert an input voltage into at least one output voltage to be supplied to the motor management circuit board, and electrically coupling the motor management circuit board to the power supply circuit board using a wiring harness.

In still another aspect, a method for heat reduction and dissipation within an electronic motor controller for an electric motor is provided. The method includes operatively attaching at least one component of a power supply circuit board to a heat sink within an electric motor chassis, the power supply circuit board including a fiberglass circuit having a plurality of components operably attached thereto, the power supply circuit card operable to convert an input voltage into at least one output voltage, operatively attaching a motor management circuit board to the electric motor chassis in a location separate from the power supply circuit board, the motor management circuit board including a plurality of driver components, current sensing components, and at least one control device in a surface mount configuration on an insulated metal substrate configured to provide a heat sinking capability to the plurality of driver components, current sensing components, and at least one control device surface mounted thereon, and providing a wiring harness between the power supply circuit board and the motor management circuit board to apply the at least one output voltage to the motor management circuit board.

The features, functions, and advantages that have been discussed can be achieved independently in various embodiments or may be combined in yet other embodiments further details of which can be seen with reference to the following description and drawings.

DETAILED DESCRIPTION

The methods, systems, and apparatus described herein facilitate efficient and economical manufacturing of an electric machine. Although described herein as associated with an electric motor, the methods, systems, and apparatus described herein may also be associated with an electric generator. An motor controller that is fabricated to include two separate circuit boards is described herein which is utilized to reduce generated heat and reduce the cost as compared to known motor controllers.

Figure 1:
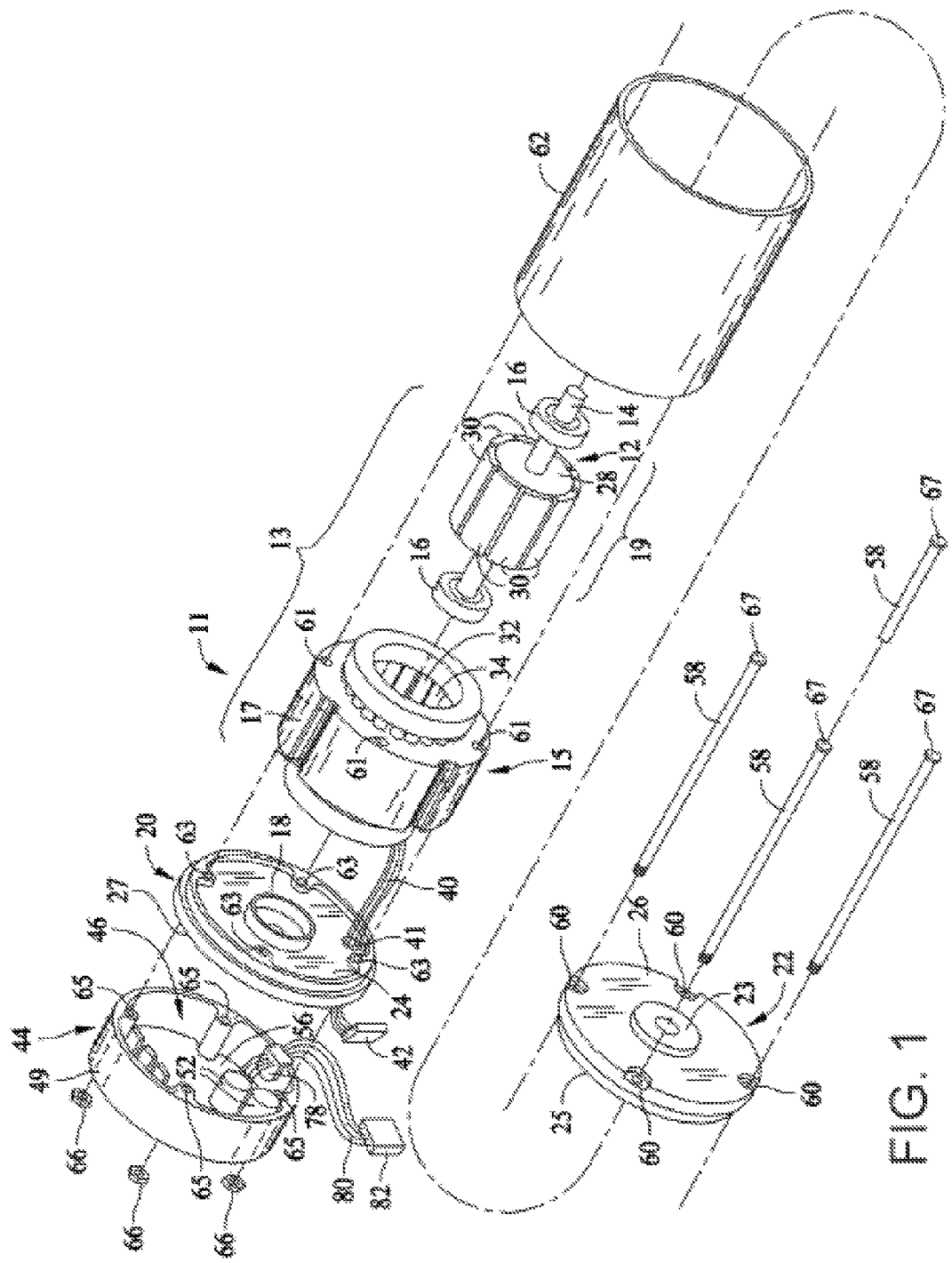
FIG. 1 is an exploded view of an integrated electronically commutated motor (ECM) and control circuit assembly.

Referring to the drawings, and more particularly to FIG. 1, reference character 11 generally designates one known integrated electronically commutated motor and control circuit assembly. Motor assembly 11 includes a brushless electronically commutated DC motor 13 having a stationary assembly 15 including a stator or core 17 and a rotatable assembly 19 including a permanent magnet rotor 12 and a shaft 14. A fan (not shown) or other means to be driven such as means for moving air through an air handling system engages the shaft 14.

Rotor 12 is mounted on and keyed to the shaft 14 journaled for rotation in conventional bearings 16. The bearings 16 are mounted in bearing supports 18 integral with a first end member 20 and a second end member 22. The end members 20 and 22 are substantially flat and parallel to each other and may be referred to as end shields. The end members 20 and 22 have inner facing sides 24, 25 between which the stationary assembly 15 and the rotatable assembly 19 are located. Each end member 20 and 22 has an outer side 26, 27 opposite its inner side 24, 25. Additionally, second end member 22 has an aperture 23 for the shaft 14 to pass through and extend out from the outer side 26.

The rotor 12 comprises a ferromagnetic core 28 and is rotatable within the bore of stator 17. In the illustrated embodiment, eight essentially identical magnetic material elements or relatively thin arcuate segments 30 of permanent magnet material, each providing a relatively constant flux field, are secured, for example, by adhesive bonding to rotor core 28. The segments 30 are magnetized to be polarized radially in relation to the rotor core 28 with adjacent segments 30 being alternately polarized as indicated. Motor having interior permanent magnets, for example, mounted within the core 28 are also known.

Stationary assembly 15 comprises a plurality of winding stages 32 adapted to be electrically energized to generate an electromagnetic field. Stages 32 are coils of wire wound around teeth 34 of the laminated stator core 17. The winding end turns extend beyond the stator end faces and winding terminal leads 40 are brought out through an aperture 41 in the first end member 20 terminating in a connector 42. While stationary assembly 15 is illustrated for purposes of disclosure, other stationary assemblies of various other constructions having different shapes and with different number of teeth are known.

Motor assembly 11 further includes a cap 44 which is mounted on the rear portion of the motor assembly 11 to enclose within the cap 44 a control circuit 46 for the motor 13. The cap 44 and the control circuit 46 may sometimes be referred to collectively as a motor control assembly. Cap 44 includes a substantially annular side wall 49. When assembly is completed, the control means 46 are positioned adjacent the outer side 27 of the first end member 20. The control circuit 46 includes a plurality of electronic components 52 and a connector (not shown) mounted on a component board 56, such as a printed circuit board. The control circuit 46 is connected to the winding stages 32 by interconnecting connector 42 and connector (not shown). The control circuit 46 applies a voltage to one or more of the winding stages 32 at a time for commutating the winding stages 32 in a preselected sequence to rotate the rotatable assembly 19 about an axis of rotation.

As mentioned herein, the engagement between the first end member and the cap 44, which is sometimes referred to as a housing, substantially forms a chamber for electronic components 52 and component board 56 which does not allow for any air flow across the components 52.

To effect this engagement, connecting elements 58 comprising a plurality of bolts pass through bolt holes 60 in the second end member 22, bolt holes 61 in core 17, bolt holes 63 in first end member 20, and bolt holes 65 in cap 44. The head 67 of the connecting elements 58 engage the second end member 22. The connecting elements 58 are adapted to urge the second end member 22 and the cap 44 toward each other thereby supporting the first end member 20, the stationary assembly 15, and the rotatable assembly 19 therebetween. Additionally, a housing, or chassis, 62 may be positioned between the first end member 20 and the second end member 22 for enclosing and protecting the stationary assembly 15 and the rotatable assembly 10.

As used herein, an element or step recited in the singular and proceeded with the word "a" or "an" should be understood as not excluding plural elements or steps unless such exclusion is explicitly recited. Furthermore, references to "one embodiment" of the present invention or the "exemplary embodiment" are not intended to be interpreted as excluding the existence of additional embodiments that also incorporate the recited features.

Figure 2:
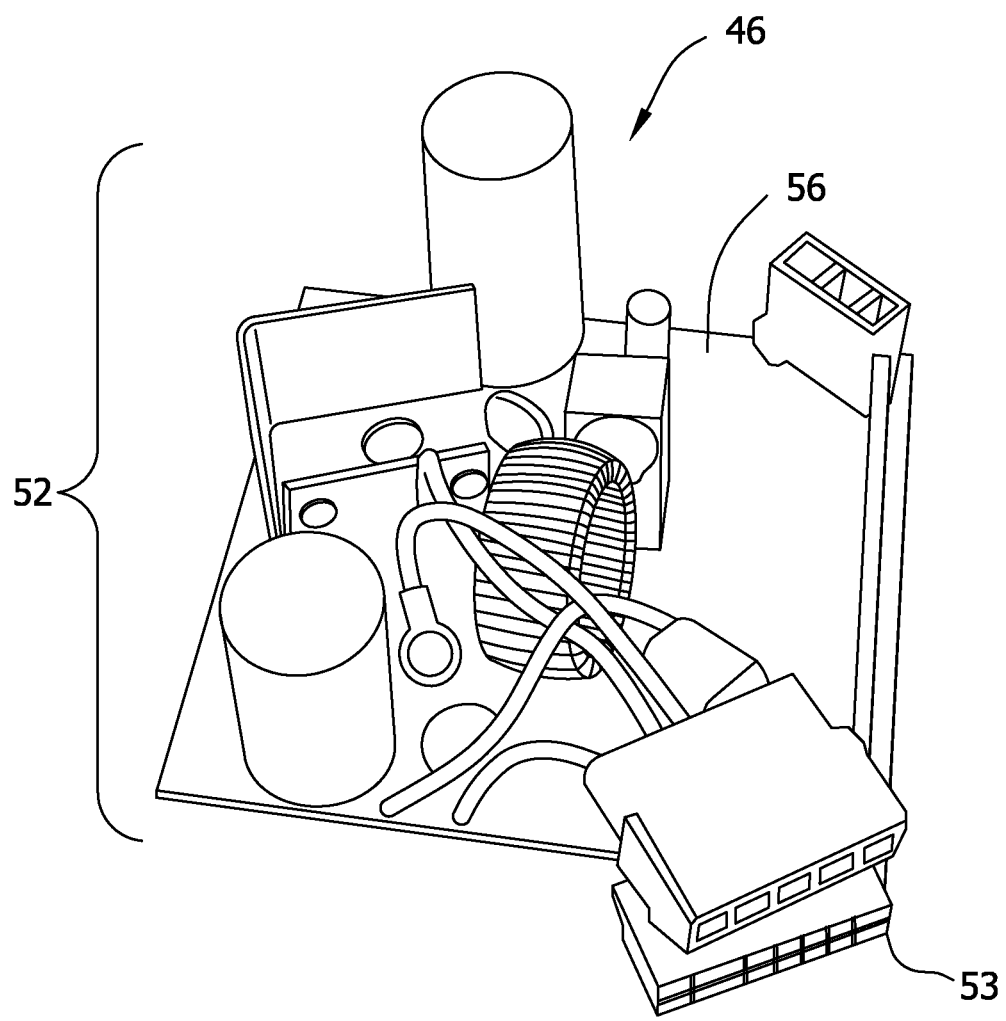
FIG. 2 is an illustration of the control circuit assembly of the ECM of FIG. 1.
Figure 3:
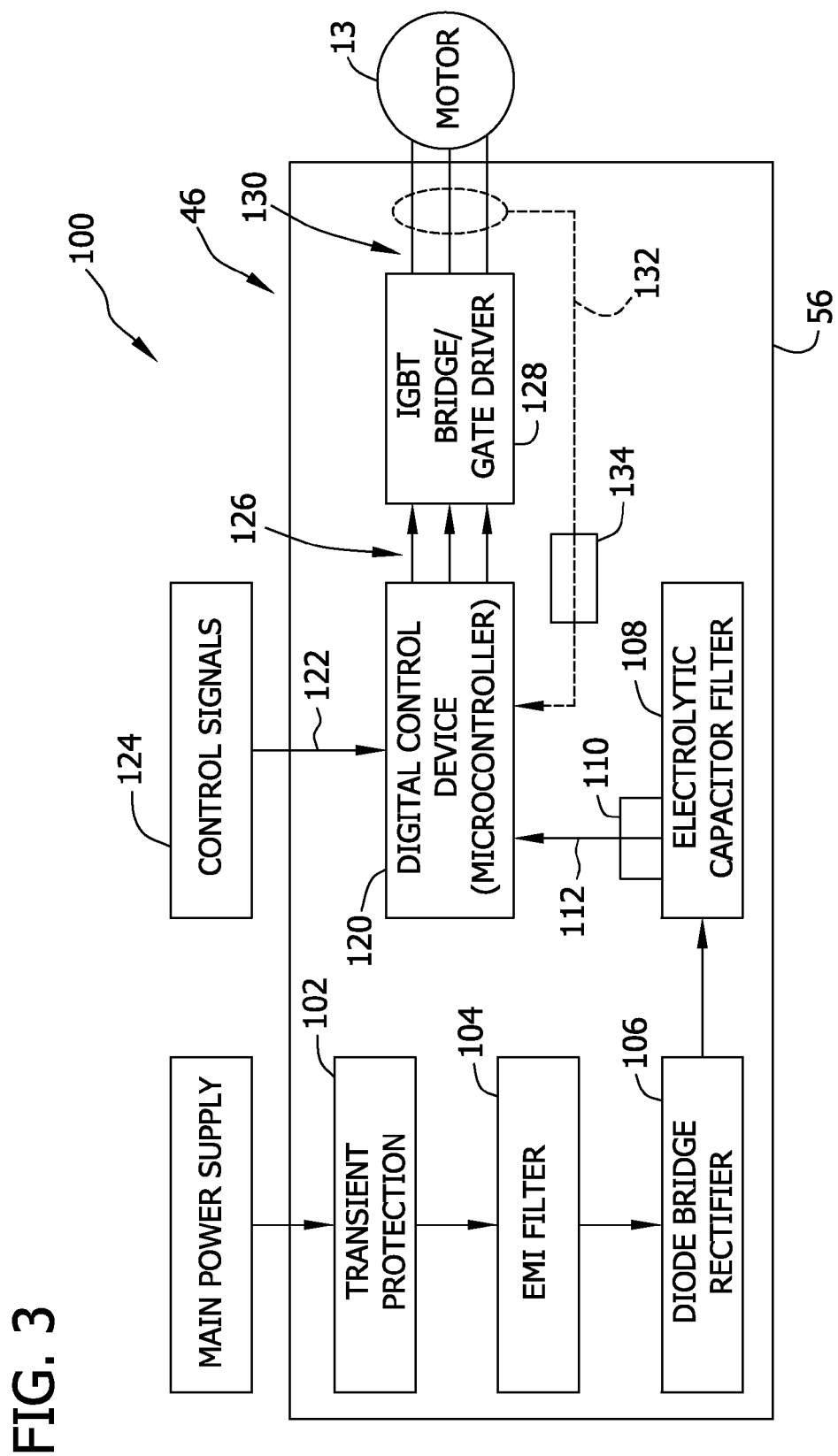
FIG. 3 is a block diagram of the control circuit assembly of the ECM of FIG. 1.

FIG. 2 is an illustration of the control circuit 46 of the ECM 13 of FIG. 1. As described above, the control circuit 46 includes a plurality of electronic components 52 and a connector 53 mounted on a component board 56, such as a printed circuit board. Referring also to the block diagram 100 of the control circuit 46 shown in FIG. 3, electronic components 52 include transient protection components 102, electromagnetic interference (EMI) protection components 104 such as capacitors for reducing EMI and a common mode inductor for reducing EMI, a bridge rectifier 106, and a capacitor filter 108 incorporating bulk capacitors which in combination with a low voltage power supply 110 provide a power supply voltage 112 to a digital control device 120 which receives control signals 122 from an external source 124. The digital control device 120 provides control signals 126 that are applied to a bridge/gate driver 128 that generate output signals 130 that are applied to the ECM 13 as described herein. A current sensor 132 provides feedback via amplifiers 134 to the digital control device 120 from the output signals 130.

Generally, the bridge rectifier 106, and capacitor filter 108 are relatively large components as they are providing an electrical power conditioning function. As such, these electrical components typically have a larger footprint and are mounted to circuit board 56 as a "through-hole" component. As a result, the remainder of the electronic components within control circuit 46 are also incorporated as through-hole components. Many of the components of control circuit 46 are available as surface mount components. Surface mount components are smaller and generate less heat.

Figure 4:
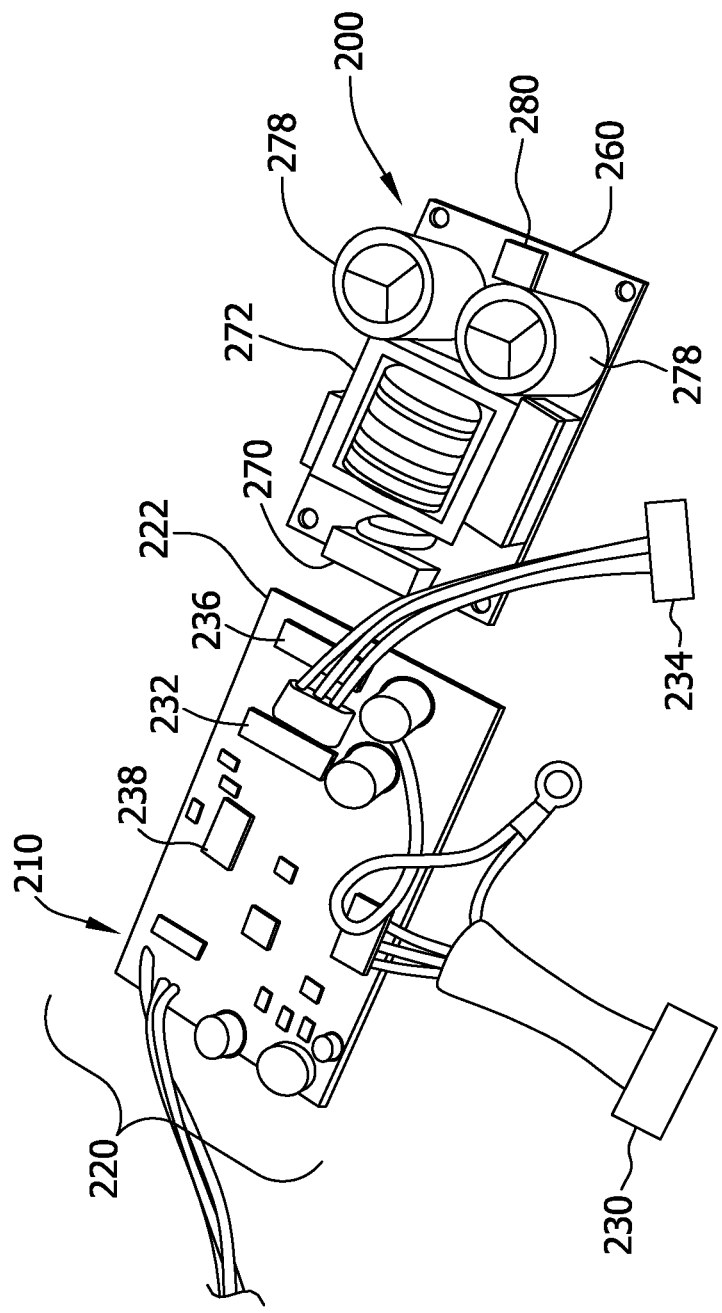
FIG. 4 is an illustration of a power supply circuit and a motor management circuit according to one embodiment which, in combination, control operation of an ECM.

FIG. 4 is an illustration of a power supply circuit 200 and a motor management circuit 210 according to one embodiment which, in combination, control operation of an ECM, for example, ECM 13. As understood, power supply circuit 200 and motor management circuit 210 serve to split the ECM control circuit into two sub-parts. The motor management circuit 210 includes components 220 that are mounted on an insulated metal substrate 222 instead of the typical fiberglass printed circuit board (such as component board 56). The components 220 are smaller as compared to components performing the same functions in control circuit 46. The components 220 can be made smaller in part due to the improved thermal management provided by the metal substrate 222. The resultant motor management circuit 210 is miniaturized and uses less material, as compared to control circuit 46, leading to a cost reduction.

Figure 5:
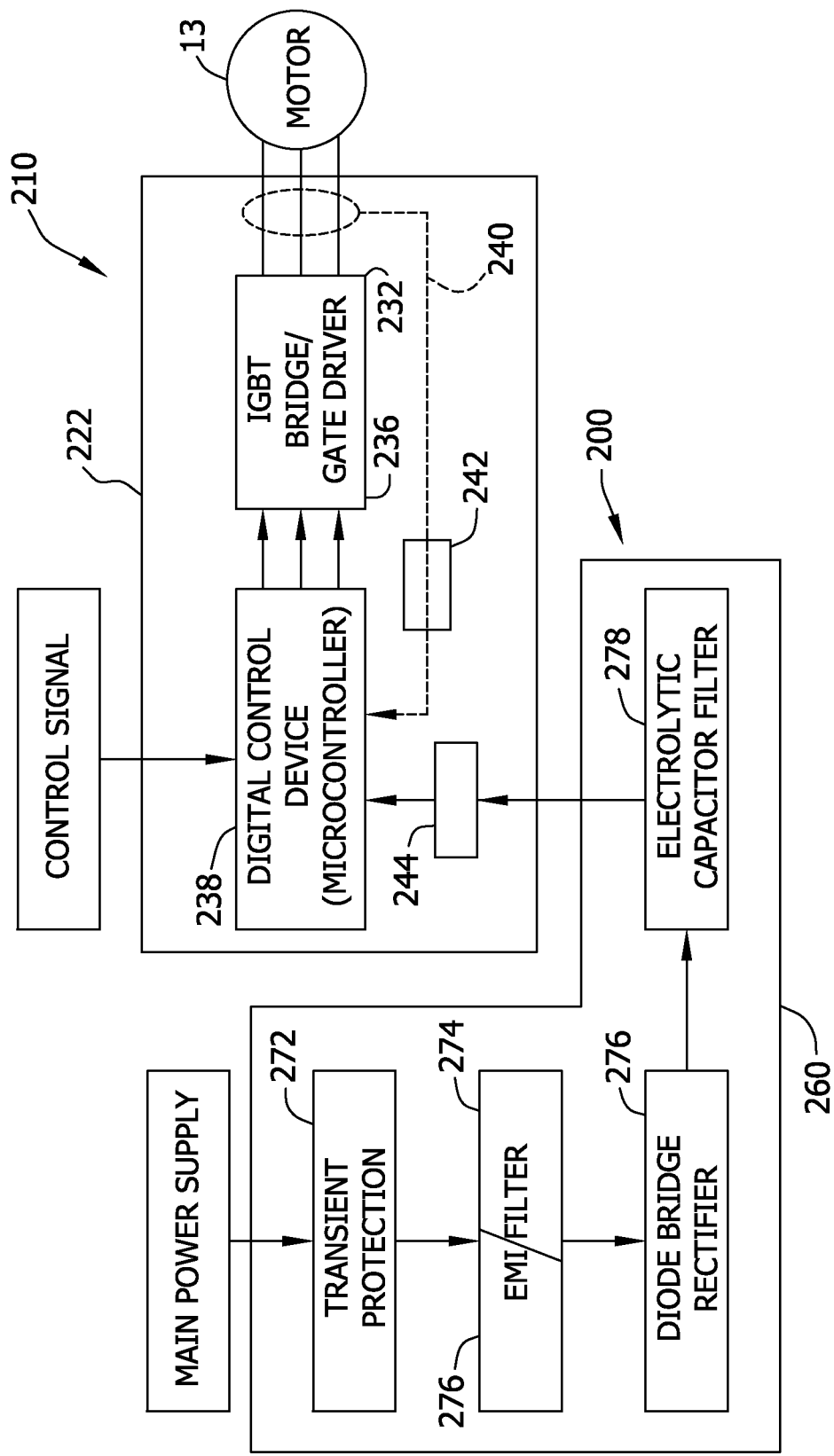
FIG. 5 is a block diagram of the power supply circuit board and the motor management circuit board.

In one embodiment, and also referring to FIG. 5, the motor management circuit 210 includes a connector 230 for receiving power from the power supply circuit 200, the power semiconductor switches 232 for switching power to the motor phases, a connector 234 for attaching the motor phases, the gate drivers 236 to allow the power semiconductor switches 232 to be switched, the digital control device 238 for providing intelligence to the switches, current sensors 240 for providing data to the digital control device 238, amplifiers 242 for amplifying the data from the current sensors 240 to the digital control device 238, and a low voltage power supply 244 for providing low voltage power for the digital control device 238 and amplifiers (not shown) from a higher voltage that is applied to the entire motor management circuit 210. The motor management circuit 210 may also include a connector for receiving a motor control demand signal which is then applied to the digital control device 238.

The power supply circuit 200 uses bulkier and more common components which do not benefit thermally from mounting on an insulated metal substrate, so these can be mounted on a more conventional, through-hole type, substrate 260 to reduce cost. In one embodiment, the power supply circuit 200 includes a connector 270 for connecting to a main power supply, a transient suppression device 272 for reducing the effect of line transients from the main power supply, capacitors 274 for reducing EMI, a common mode inductor 276 for reducing EMI, a diode bridge 276 for converting the AC main power supply to a DC voltage, bulk capacitors 278 to provide power "hold up" during periods where the AC main power supply voltage is low, and a connector 280 to provide the resulting DC power to the motor management circuit 210.

While the function for both the embodiments of FIG. 2 and FIG. 4 is the same, the controller made according to the FIG. 4 embodiment has a significant cost benefit. Due to the size reduction of the motor management circuit 210, the entire controller is reduced in size. Due to the fabrication of the motor management circuit 210 and power supply circuit 200 as two separate items mounting and packaging is simplified and improved as the motor management circuit 210 can be attached conveniently to a heatsink, while the bulkier power supply circuit 200 can be located elsewhere wherever space is available.

Cost is reduced due to the use of smaller components on the motor management circuit 210. For example, cost is reduced due to the smaller surface area of the insulated metal substrate, which allows improved process yield during manufacture. Only components that emit electromagnetic noise are mounted on the insulated metal substrate, so the EMI of the resulting product is improved at best efficiency.

The components used on the motor management circuit 210 are typically of high cost sensitivity, excellent cost scalability (i.e., they reduce in cost with volume) and long order lead times, while the components used on the power supply circuit are commodity type components which are typically less expensive, do not reduce significantly in cost with volume, and have a short order lead time. As a result motor management circuit 210 can be standardized across a range of products and applications.

As a result of the differences between the motor management circuit 210 and the power supply circuit 200, the power supply circuit can be quickly and inexpensively re-engineered for different applications, resulting in a lower cost to the business and reduced development time for new products. Further, a standardized motor management circuit 210 can be purchased and/or fabricated with the volume of several totally different target product and applications combined, reducing the cost of the components used on this sub-part for each target product and application.

The described embodiments are directed to an electronic motor controller that includes a motor management circuit and a power supply circuit that are physically separate from one another. The motor management circuit includes an insulated metal substrate, a plurality of driver components operably attached to the insulated metal substrate and operable to provide output signals for application to windings of an electric motor, at least one current sensor operable for sensing an amount of current applied to the windings of the electric motor, and at least one control device operably attached to the insulated metal substrate and programmed to control operation of the driver components. The power supply circuit includes a circuit card fabricated from a composite material and a plurality of power processing components operably attached to the circuit card and operable to convert an input voltage into at least one output voltage to be supplied to the motor management circuit board.

In embodiments, the power supply circuit is operable to convert an alternating current voltage into a direct current voltage and the motor management circuit includes at least one DC-to-DC converter operable to convert the direct current voltage from the power supply circuit board into at least one low voltage DC voltage source for application to the driver components and the control device(s). In another configuration, the power supply circuit provides at least one DC voltage to a plurality of motor management circuit boards.

As described above, a plurality of driver components generally includes a plurality of power semiconductor switches, and a plurality of gate drivers electrically connected to the control device and operable for controlling switching of the power semiconductor switches. In the motor management circuit, at least a portion of the driver components, the current sensors, and at least one control device are miniaturized due to the heat sink capability of the insulated metal substrate, which is further operable as a heat sink for the driver components and the at least one control device. To accomplish the improvements described herein, the motor management circuit utilizes a plurality of surface mounted components and the power supply circuit utilizes a plurality of through-hole mounted components.

The embodiments result in a method for reducing an overall size of an electronic motor controller for an electric motor, which includes fabricating a circuit board using an insulated metal substrate operable as a heat sink for a plurality of components mounted thereon, attaching a plurality of driver components, at least one current sensor, and at least one control device to the circuit board to form a motor management circuit board, fabricating a printed circuit board physically separate from the motor management circuit board using a composite material, attaching a plurality of power processing components to the printed circuit card to form a power supply circuit board operable to convert an input voltage into at least one output voltage to be supplied to the motor management circuit board, and electrically coupling the motor management circuit board to the power supply circuit board using a wiring harness. Attaching a plurality of driver components, at least one current sensor, and at least one control device to the circuit board includes attaching a plurality of surface mount components to the insulated metal substrate and attaching a plurality of power processing components to the printed circuit card includes attaching a plurality of through-hole mounted components to the composite material printed circuit board.

Additionally a method for heat reduction and dissipation within an electronic motor controller for an electric motor results from the describe embodiments which includes operatively attaching at least one component of a power supply circuit board to a heat sink within an electric motor chassis, the power supply circuit board including a fiberglass circuit having a plurality of components operably attached thereto, the power supply circuit card operable to convert an input voltage into at least one output voltage, operatively attaching a motor management circuit board to the electric motor chassis in a location separate from the power supply circuit board, the motor management circuit board including a plurality of driver components, current sensing components, and at least one control device in a surface mount configuration on an insulated metal substrate configured to provide a heat sinking capability to the plurality of driver components, current sensing components, and at least one control device surface mounted thereon, and providing a wiring harness between the power supply circuit board and the motor management circuit board to apply the at least one output voltage to the motor management circuit board.

This written description uses examples to disclose various embodiments, which include the best mode, to enable any person skilled in the art to practice those embodiments, including making and using any devices or systems and performing any incorporated methods. The patentable scope is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

What is claimed is:

1. An electric motor comprising an electronic motor controller comprising:
   a motor management circuit comprising:
      an insulated metal substrate;
      a plurality of driver components operably attached to said insulated metal substrate and operable to provide output signals for application to windings of said electric motor;
      at least one current sensor operable for sensing an amount of current applied to the windings of said electric motor; and
      at least one control device operably attached to said insulated metal substrate and programmed to control operation of said driver components; and
   a power supply circuit physically separate from said motor management circuit, said power supply circuit comprising:
      a circuit card comprising a composite material; and
      a plurality of power processing components operably attached to said circuit card and operable to convert an input voltage into at least one output voltage to be supplied to said motor management circuit.

2. The electric motor according to claim 1 wherein:
   said power supply circuit is operable to convert an alternating current voltage into a direct current voltage; and
   said motor management circuit comprises at least one DC-to-DC converter operable to convert the direct current voltage from said power supply circuit into at least one low voltage DC voltage source for application to said driver components and said at least one control device.

3. The electric motor according to claim 1 wherein said power supply circuit is configured to provide at least one DC voltage to a plurality of motor management circuits.

4. The electric motor according to claim 1 wherein said plurality of driver components comprises:
   a plurality of power semiconductor switches; and
   a plurality of gate drivers electrically connected to said at least one control device and operable for controlling switching of said plurality of power semiconductor switches.

5. The electric motor according to claim 1 wherein at least a portion of said driver components, said at least one current sensor, and said at least one control device are miniaturized due to the heat sink capability of said insulated metal substrate.

6. The electric motor according to claim 1 wherein said insulated metal substrate operable as a heat sink for said driver components and said at least one control device.

7. The electric motor according to claim 1 wherein:
   said motor management circuit comprises a plurality of surface mounted components; and
   said power supply circuit comprises a plurality of through-hole mounted components.

8. The electric motor according to claim 1 wherein said power supply circuit comprises:
   a transient suppression device for reducing the effect of line transients;
   an electromagnetic interference (EMI) filter;
   a bridge rectifier; and
   bulk capacitors, said transient suppression device, said EMI filter, said bridge rectifier, and said bulk capacitors operable in combination to convert an input power AC voltage to a rectified, filtered DC voltage for application to said motor management circuit.

9. The electric motor according to claim 1 wherein said motor management circuit is configured to receive a motor control demand signal for input into said at least one control device.

10. The electric motor according to claim 1 further comprising a heat sink, said motor management circuit attached to said heat sink.

11. A method for reducing an overall size of an electronic motor controller for an electric motor, said method comprising:
   fabricating a circuit board using an insulated metal substrate operable as a heat sink for a plurality of components mounted thereon;
   attaching a plurality of driver components, at least one current sensor, and at least one control device to the circuit board to form a motor management circuit board;
   fabricating a printed circuit board physically separate from the motor management circuit board using a composite material;
   attaching a plurality of power processing components to the printed circuit card to form a power supply circuit board operable to convert an input voltage into at least one output voltage to be supplied to the motor management circuit board; and
   electrically coupling the motor management circuit board to the power supply circuit board using a wiring harness.

12. The method according to claim 11 wherein:
   attaching a plurality of driver components, at least one current sensor, and at least one control device to the circuit board comprises attaching a plurality of surface mount components to the insulated metal substrate; and
   attaching a plurality of power processing components to the printed circuit card comprises attaching a plurality of through-hole mounted components to the composite material printed circuit board.

13. The method according to claim 11 further comprising attaching the insulated metal substrate to a heat sink.

14. A method for heat reduction and dissipation within an electronic motor controller for an electric motor, said method comprising:
   operatively attaching at least one component of a power supply circuit board to a heat sink within an electric motor chassis, the power supply circuit board including a fiberglass circuit having a plurality of components operably attached thereto, the power supply circuit card operable to convert an input voltage into at least one output voltage;
   operatively attaching a motor management circuit board to the electric motor chassis in a location separate from the power supply circuit board, the motor management circuit board including a plurality of driver components, current sensing components, and at least one control device in a surface mount configuration on an insulated metal substrate configured to provide a heat sinking capability to the plurality of driver components, current sensing components, and at least one control device surface mounted thereon; and providing a wiring harness between the power supply circuit board and the motor management circuit board to apply the at least one output voltage to the motor management circuit board.

15. An electronic motor controller comprising:
a motor management circuit comprising:
   an insulated metal substrate;
   a plurality of driver components operably attached to said insulated metal substrate and operable to provide output signals for application to windings of said electric motor;
   at least one current sensor operable for sensing an amount of current applied to the windings of said electric motor; and
   at least one control device operably attached to said insulated metal substrate and programmed to control operation of said driver components; and
a power supply circuit physically separate from said motor management circuit, said power supply circuit comprising:
   a circuit card comprising a composite material; and
   a plurality of power processing components operably attached to said circuit card and operable to convert an input voltage into at least one output voltage to be supplied to said motor management circuit.

16. The electronic motor controller according to claim 15 wherein wherein at least a portion of said driver components, said at least one current sensor, and said at least one control device are miniaturized due to the heat sink capability of said insulated metal substrate.

17. The electronic motor controller according to claim 15 wherein said insulated metal substrate is operable as a heat sink for said driver components and said at least one control device.

18. The electronic motor controller according to claim 15 wherein:
   said motor management circuit comprises a plurality of surface mounted components; and
   said power supply circuit comprises a plurality of through-hole mounted components.

19. The electronic motor controller according to claim 15 wherein said motor management circuit is configured to receive a motor control demand signal for input into said at least one control device.

* * * * *